United States Patent
Liaw

(10) Patent No.: US 9,691,471 B2
(45) Date of Patent: Jun. 27, 2017

(54) SRAM CELLS WITH VERTICAL GATE-ALL-ROUND MOSFETS

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/486,293

(22) Filed: Sep. 15, 2014

(65) Prior Publication Data

US 2016/0078922 A1    Mar. 17, 2016

(51) Int. Cl.
| | | |
|---|---|---|
| G11C 11/00 | (2006.01) | |
| G11C 11/412 | (2006.01) | |
| H01L 29/66 | (2006.01) | |
| H01L 27/02 | (2006.01) | |
| H01L 27/11 | (2006.01) | |

(52) U.S. Cl.
CPC ........ G11C 11/412 (2013.01); H01L 27/0207 (2013.01); H01L 27/1104 (2013.01); H01L 29/66666 (2013.01)

(58) Field of Classification Search
USPC ........................................................ 365/154
See application file for complete search history.

(56) References Cited

U.S. PATENT DOCUMENTS

| 8,058,683 | B2 | 11/2011 | Yoon et al. | |
|---|---|---|---|---|
| 2004/0113207 | A1* | 6/2004 | Hsu ..................... | G11C 11/412 257/368 |
| 2006/0171193 | A1* | 8/2006 | Asayama ............. | G11C 11/413 365/154 |
| 2010/0188891 | A1* | 7/2010 | Taniguchi .......... | G11C 14/0081 365/158 |
| 2014/0151811 | A1* | 6/2014 | Liaw ................... | H01L 27/1108 257/368 |

FOREIGN PATENT DOCUMENTS

KR    20080068544 A    7/2008

* cited by examiner

*Primary Examiner* — Anthan Tran
(74) *Attorney, Agent, or Firm* — Slater Matsil, LLP

(57) ABSTRACT

A Static Random Access Memory (SRAM) cell includes a first boundary and a second boundary opposite to, and parallel to, the first boundary, a first and a second pull-up transistor, a first and a second pull-down transistor forming cross-latched inverters with the first and the second pull-up transistors, and a first and a second pass-gate transistor. Each of the first and the second pull-up transistors, the first and the second pull-down transistors, and the first and the second pass-gate transistors includes a bottom plate as a first source/drain region, a channel over the bottom plate, and a top plate over the channel as a second source/drain region. The SRAM cell further includes a first, a second, a third, and a fourth active region, each extending from the first boundary to the second boundary.

19 Claims, 17 Drawing Sheets

US 9,691,471 B2

SRAM CELLS WITH VERTICAL GATE-ALL-ROUND MOSFETS

BACKGROUND

Static Random Access Memory (SRAM) is commonly used in integrated circuits. SRAM cells have the advantageous feature of holding data without a need for refreshing. With the increasingly demanding requirement to the speed of integrated circuits, the read speed and write speed of SRAM cells also become more important. Furthermore, the parasitic capacitance of the Metal-Oxide-Semiconductor Field-Effect Transistors (MOSFETs) in the SRAM needs to be very low to suit for the high-speed SRAM cells.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
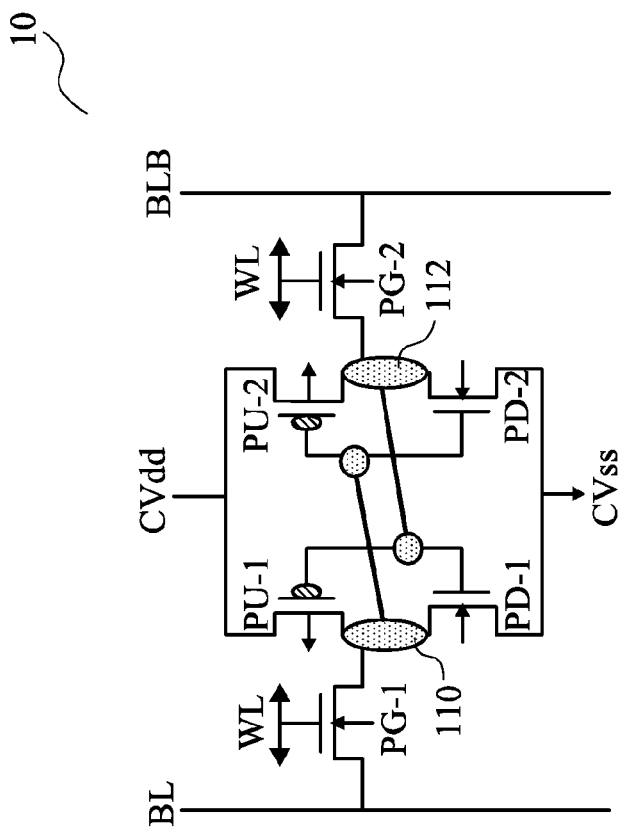
FIGS. 1 and 2 are circuit diagrams of a Static Random Access Memory (SRAM) cell comprising n-type pass-gate transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static Random Access Memory (SRAM) cells including Vertical Gate-All-Around (VGAA) transistors are provided in accordance with various exemplary embodiments. The variations of the embodiments are discussed. Throughout the various views and illustrative embodiments, like reference numbers are used to designate like elements.

FIG. 1 illustrates a circuit diagram of SRAM cell 10 in accordance with some embodiments. SRAM cell 10 includes pass-gate transistors PG-1 and PG-2, pull-up transistors PU-1 and PU-2, which are P-type Metal-Oxide-Semiconductor (PMOS) transistors, and pull-down transistors PD-1 and PD-2, which are N-type Metal-Oxide-Semiconductor (NMOS) transistors. Pass-gate transistors PG-1 and PG-2 are N-type transistors in accordance with some embodiments. The gates of pass-gate transistors PG-1 and PG-2 are connected to, and controlled by, word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in storage node 110 and storage node 112. The stored bit can be written into, or read from, SRAM cell 10 through bit-line line BL and bit-line Bar BLB, wherein BL and BLB may carry complementary bit-line signals. SRAM cell 10 is powered through a positive power supply node CVdd that has a positive power supply voltage (also denoted as CVdd). SRAM cell 10 is also connected to power supply node/voltage CVss, which may be an electrical ground.

The sources of pull-up transistors PU-1 and PU-2 are connected to power supply voltage/node CVdd. The sources of pull-down transistors PD-1 and PD-2 are connected to power supply voltage/node CVss. The gates of transistors PU-1 and PD-1 are connected to the drains of transistors PU-2 and PD-2, which connection node is storage node 112. The gates of transistors PU-2 and PD-2 are connected to the drains of transistors PU-1 and PD-1, which connection node is storage node 110. The source region of pass-gate transistor PG-1 is connected to bit-line BL at a bit-line node, and the drain region of pass-gate transistor PG-1 is connected to storage node 110. The source region of pass-gate transistor PG-2 is connected to bit-line bar BLB (a complementary bit-line) at a bit-line bar node, and the drain region of pass-gate transistor PG-2 is connected to storage node 112.

Figure 2:
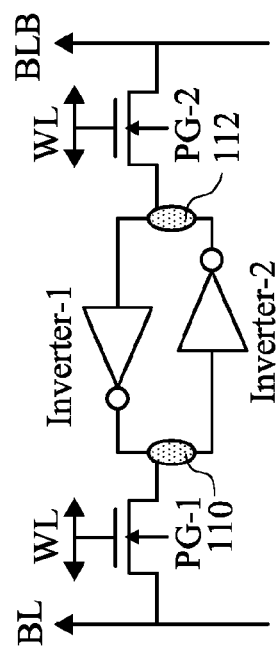

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 is connected to transistor PG-1 and the input of the second inverter Inverter-2. The output of second inverter Inverter-2 is connected to transistor PG-2 and the input of second inverter Inverter-2.

Figure 3:
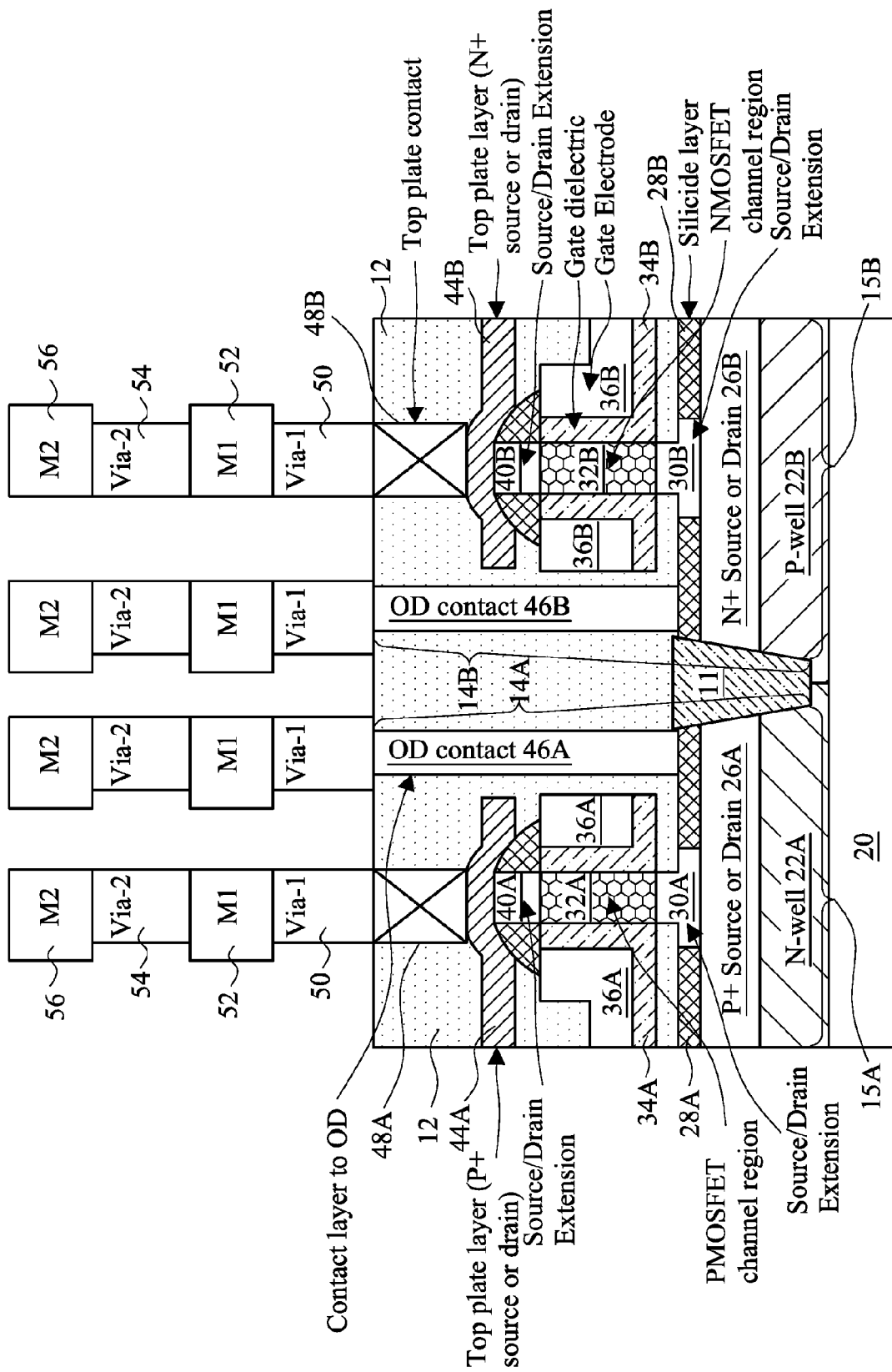
FIG. 3 is a cross-sectional view of an n-type and a p-type Vertical Gate-All-Around (VGAA) transistor in accordance with some embodiments.

FIG. 3 illustrates a cross-sectional view of exemplary VGAA transistors including p-type VGAA transistor 14A and n-type VGAA transistor 14B in accordance with some embodiments. VGAA transistors 14A and 14B have vertical channels, and gate dielectrics and gate electrodes form full rings encircling the respective vertical channels. Furthermore, in a VGAA transistor, one of the source/drain regions is over the respective channel, and the other one of the source/drain regions is underlying the respective channel. Shallow Trench Isolation (STI) regions 11 define portions of the semiconductor regions (such as N-well 22A, P-well 22B, and/or semiconductor substrate 20) as a plurality of active regions (also referred to as OD regions). N-well 22A may be doped with P, As, Sb, Ge, N, C, or combinations thereof. P-well 22B may be doped with B11, $BF_2$, In, Ge, N, C, or combinations thereof. N-well 22A and P-well 22B may be doped through implantation with a dosage between about $1E12/cm^2$ and about $5E13/cm^2$. In some embodiments, the OD regions are parts of semiconductor regions (22A, 22B, and 20) higher than the bottom surfaces of STI regions 11. For example, in FIG. 3, active regions 15 (such as 15A and 15B) are illustrated. VGAA transistors 14A and 14B are formed based on active regions 15A and 15B, respectively.

P-type VGAA transistor 14A includes a first source/drain (P+) region 26A over and in contact with N-well 22A, and silicide region 28A over P+ source/drain region 26A. P+ region 26A may be formed by epitaxy and/or implantation. P+ region 26A and silicide region 28A are in combination referred to as the bottom plate of transistor 14A. In some embodiments, source/drain extension region 30A, which may be a P+ region, is formed over source/drain region 26A. Throughout the description, source/drain extension regions are also referred to as Lightly-Doped Drain (LDD) regions, although they may be lightly doped (for example, with doping concentrations lower than about $1E17/cm^3$, represented as "P−"), heavily doped (for example, with doping concentrations higher than about $1E21/cm^3$, represented as "P+"), or moderately doped (for example, with doping concentrations between about $1E17/cm^3$ and about $1E21/cm^3$, represented as "P"). The source/drain regions of P-type VGAA transistor 14A may be formed through doping and photo lithography processes, and may be doped with B11, $BF_2$, In, N, C, or combinations thereof.

Channel region 32A, which is an n-type semiconductor region, is a vertical channel formed over source/drain extension region 30A. Channel region 32A may comprise a semiconductor material (which may be formed by epitaxy) such as silicon, germanium, SiGe, SiC, SP, SiPC, a III-V compound semiconductor, or the like. For example, the III-V compound semiconductor may comprise InP, InAs, GaAs, AlInAs, InGaP, InGaAs, GaAsSb, GaPN, AlPN, or combinations thereof. Gate dielectric 34A encircles channel region 32A, and may be formed of silicon oxide, silicon nitride, a high-k dielectric material(s), combinations thereof, or multi-layers thereof. Gate electrode 36A, which may be formed of polysilicon or another conductive material such as a metal, a metal alloy, a metal silicide, etc., is formed to encircle gate dielectric 34A. LDD region 40A is formed over channel region 32A. Top plate 44A, which is a conductive layer formed of polysilicon, silicide, a metal, a metal alloy, or the like, is formed over LDD region 40A. Top plate 44A acts as the second source/drain region of VGAA transistor 14A.

N-type VGAA transistor 14B includes a first source/drain (N+) region 26B over and in contact with P-well 22B, and silicide region 28B over N+ source/drain region 26B. N+ region 26B may be formed by epitaxy and/or implantation. N+ region 26B and silicide region 28B are in combination referred to as the bottom plate of transistor 14B. In some embodiments, source/drain extension region 30B, which may be an N+ region, an N region, or an N− region, is formed over source/drain region 26B. The source/drain regions of N-type VGAA transistor 14B may be formed through doping and lithography processes, and may be doped with B11, $BF_2$, In, Ge, N, C, or combinations thereof.

Channel region 32B, which is a p-type semiconductor region, is a vertical channel over source/drain extension region 30B. Channel region 32B may comprise a semiconductor material selected from the same candidate semiconductor materials for forming channel region 32A. Gate dielectric 34B encircles channel region 32B. Gate electrode 36B, which may be formed of polysilicon or another conductive material such as a metal, a metal alloy, a metal silicide, etc., is formed to encircle gate dielectric 34B. N+/N/N− LDD region 40B is formed over channel region 32B. Top plate 44B, which is a conductive layer formed of polysilicon, silicide, a metal, a metal alloy, or the like, is formed over LDD region 40B. Top plate 44B acts as the second source/drain region of VGAA transistor 14B. Top pates 44A and 44B may be formed of silicon, a silicide (which may be Ti based, Co based, Ni based, or Pt based), TiN, TaN, W, Cu, Al, or combinations thereof.

In some exemplary embodiments, the high-k dielectric material used in gate dielectrics 34A and 34B include SiON, $Si_3N_4$, $Ta_2O_5$, $Al_2O_3$, multi-layers thereof, or combinations thereof. Furthermore, the high-k dielectric material may include tetraethyl orthosilicate (TEOS), a nitrogen containing oxide, a nitrided oxide, an Hf containing oxide, a tantalum containing oxide, an aluminum containing oxide, or combinations thereof. The k value of the high-k dielectric material may be higher than about 10. Gate electrode 36A may have a high work-function, for example, higher than about 4.5 eV, and may be between about 4.5 eV and about 5.0 eV. Gate electrode 36B may have a low work-function, for example, lower than about 4.5 eV, and may be between about 4.0 eV and about 4.5 eV. The appropriate work function may be tuned by selecting an appropriate material selected from polysilicon, TiN, TaN, TiAl, TaAl, a Ti-containing layer, a Ta-containing layer, a nitrogen-containing layer, a W-containing layer, a refractory material, etc.

Top plate contacts 48 (such as 48A and 48B) are formed over and electrically connected to top plates 44A and 44B, respectively. OD contacts 46A and 46B are connected to the bottom plates (source/drain regions) 28A/26A and 28B/26B, respectively. VGAA transistors 14A and 14B are formed in dielectric layer 12, which may include a plurality of dielectric layers. The transistors PG-1, PG-2, PU-1, PU-2, PD-1, and PD-2 (FIGS. 5 through 12 and FIGS. 16 through 19) in the embodiments of the present disclosure may have the structures as shown in FIG. 3.

The interconnect structure connected to VGAA transistors 14A and 14B may include first level (referred to as via-1) vias 50. First level metal lines/pads (referred to as M1 lines/pads) 52 are over and connected to via-1 vias 50.

Second level vias (referred to as via-2) 54 are over and connected to M1 lines/pads 52. Second level metal lines/pads (referred to as M2 lines/pads) 56 are over and connected to via-2 vias 54. Throughout the description, a sign followed by sign "-" and a number may be postfixed to reference notations 50, 52, 54, and 56 to further refer to individual vias and metal lines/pads.

Figure 4:
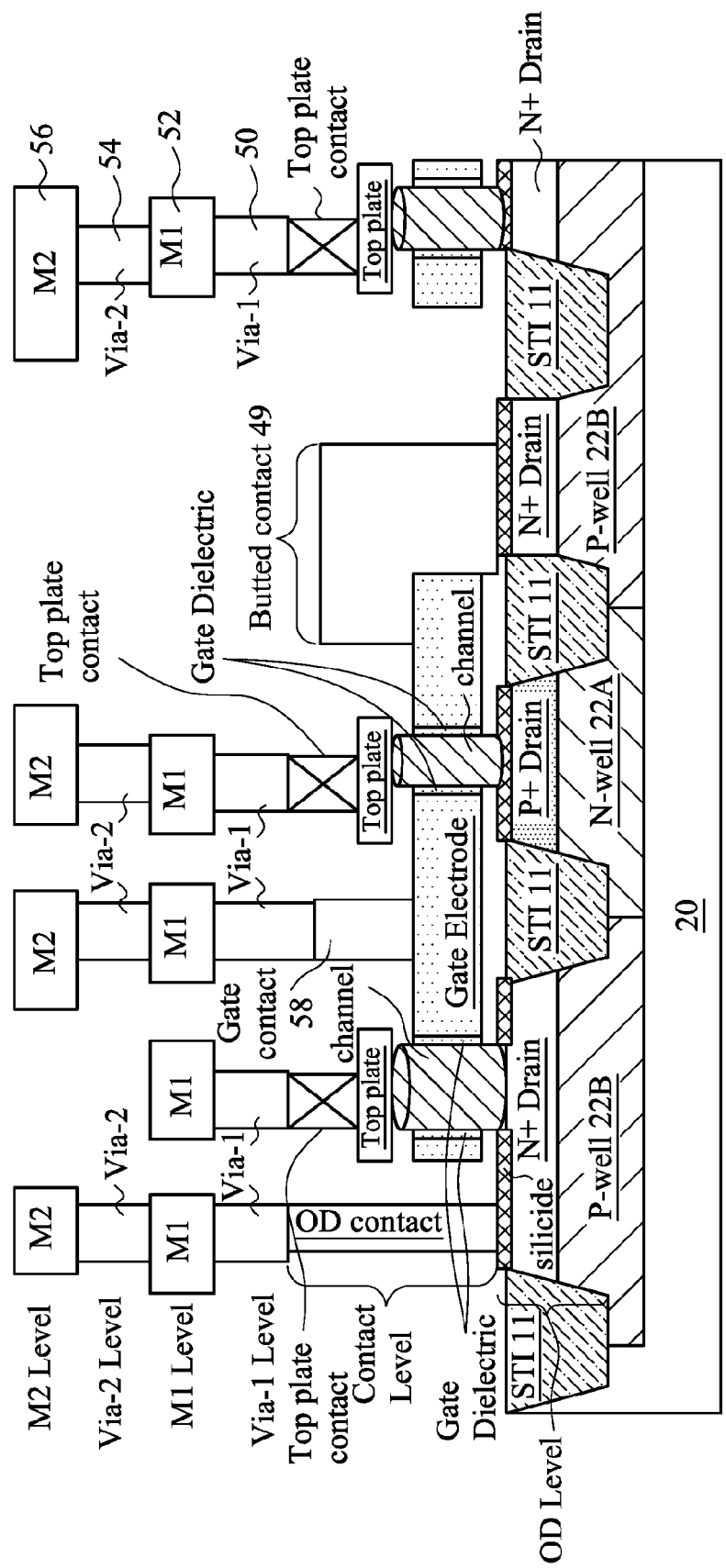
FIG. 4 illustrates a schematic cross-sectional view of various levels of VGAA transistors and the features in different levels in accordance with some embodiments.

FIG. 4 schematically illustrates the features and the respective levels discussed throughout the description. The features in FIG. 4 also correspond to the features in FIG. 3. Each of the levels and layers includes one or more dielectric layers and the conductive features formed therein. The conductive features that are at the same level may have top surfaces substantially level to each other, and bottom surfaces substantially level to each other, and may be formed simultaneously. For example, there is an OD level, in which ODs (active regions) 15 (including 15A and 15B) are located. A "contact level" is over the OD level, wherein contact plugs are formed in the contact level. The features in the contact level include OD contacts (such as 46A and 46B in FIG. 3), top plate contacts (such as 48A and 48B in FIG. 3), gate contacts (such as 58 in FIG. 4), butted contacts (such as 49 in FIG. 4), etc. Over the contact level resides via-1 level, M1 level, via-2 level, and M2 level. In subsequent discussion, when features are discussed, their levels may be found referring to their names and their reference numerals in FIGS. 3 and 4. The reference numerals of the features throughout the description may be referred to using the references numerals in FIGS. 3 and 4 followed by sign "-" and a number. For example, when a feature is denoted as 52 followed by sign "-" and a number, it indicates this feature is one of the features in the M1 level. When a feature is denoted as 15 followed by sign "-" and a number, it indicates that this feature is one of active regions.

FIG. 4 also includes butted contact 49, which includes a bottom surface landing on a gate electrode, and another bottom surface landing on an active region such as an N+ region, a P+ region, or the respective overlying silicide region (not shown). Furthermore, gate contact 58 is further illustrated. In the exemplary embodiment shown in FIG. 4, gate contact 58 lands on and electrically connected to a gate electrode, which is shared by two VGAA transistors.

Figure 5:
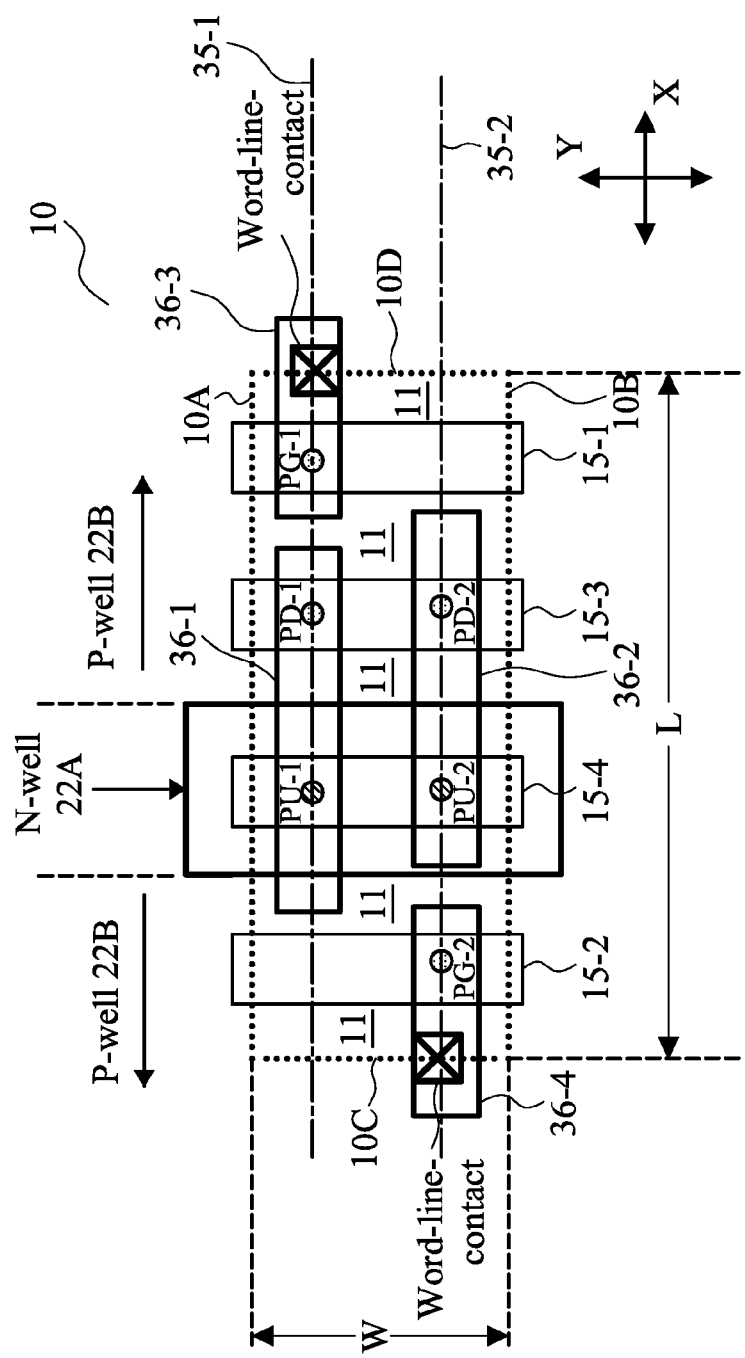
FIG. 5 is an exemplary layout of an SRAM cell in accordance with some embodiments, wherein the channel regions of VGAA transistors are nano-wires.

FIG. 5 illustrates a layout of SRAM cell 10 in accordance with some exemplary embodiments. Boundaries 10A, 10B, 10C, and 10D of SRAM cell 10 are illustrated using dashed lines, which form a rectangle. In some embodiments, long boundaries 10A and 10B of SRAM cell 10 have length L, and short boundaries 10C and 10D of SRAM cell 10 have width W, with ratio L/W being greater than 1.0, or greater than about 2.5. Throughout the description, the extending direction (the X direction) of long boundaries 10A and 10B are referred to as the lengthwise direction of SRAM cell 10, and the direction (the Y direction) of short boundaries 10C and 10D are referred to as the widthwise direction of SRAM cell 10. SRAM cell 10 includes N-well 22A and two P-Wells 22B on the opposite sides of N-well 22A. SRAM cell 10 includes OD regions 15 (including 15-1, 15-2, 15-3, and 15-4), which are the active regions at the "OD level" as in FIG. 4. In some embodiments, in SRAM cell 10, there is no additional OD other than OD regions 15-1, 15-2, 15-3, and 15-4.

Each of OD regions 15-1, 15-2, 15-3, and 15-4 is a continuous OD that extends from boundary 10A to the opposite boundary 10B. When boundaries 10A and 10B are butted to the boundaries of neighboring SRAM cells, OD regions 15-1, 15-2, 15-3, and 15-4 will be connected to the correspond ODs of the neighboring SRAM cells. OD regions 15-1, 15-2, 15-3, and 15-4 are parallel with each other, and extend in the widthwise direction of SRAM cell 10. STI regions 11 separate neighboring OD regions 15-1, 15-2, 15-3, and 15-4 from each other. Accordingly, the ODs in the present disclosure are different from the ODs in conventional SRAM cells. The ODs in the conventional SRAM cells include four ODs in each SRAM cell, with two the ODs having ends terminated inside the SRAM cell and do not extend to boundaries. OD region 15-1 is used as bit line BL. OD region 15-2 is used as bit line bar BLB. OD region 15-3 is used as a power rail (node) for conducting power supply voltage CVss (which may be electrical ground), and also acts as the source regions of transistors PD-1 and PD-2. OD region 15-4 is used as a power rail (node) for conducting positive power supply voltage CVdd, and also acts as the source regions of transistors PU-1 and PU-2. OD regions 15-1, 15-2, and 15-3 are in P-wells 22B, and OD region 15-4 is in N-well 22A. Although OD regions 15-1, 15-2, 15-3, and 15-4 are shown as having the same width, they may have different widths. For example, OD region 15-3 (the CVss line) may be wider (in the X direction) than OD region 15-4 (the CVdd line) by more than about 20 percent.

SRAM cell 10 includes transistors PG-1, PG-2, PU-1, PU-2, PD-1, and PD-2, with the channel regions of the transistors illustrated as circles. The circles represent the top-view shapes of the channel regions (refer to 32A and 32B in FIG. 3) of the transistors in accordance with some embodiments, wherein the channel regions may be nanowires. The top-view shapes of the channel regions may have other shapes including, and not limited to, rectangular shapes, hexagonal shapes, triangular shapes, ellipses, or the like. Each of transistors PG-1, PG-2, PU-1, PU-2, PD-1, and PD-2 may have the structure shown in FIG. 3, depending on whether the transistor is a p-type or an n-type VGAA transistor. Accordingly, each of transistors PG-1, PG-2, PU-1, PU-2, PD-1, and PD-2 includes an OD as a bottom plate (and a first source/drain region), and a top plate as a second source/drain region.

OD region 15-1 is used to form transistor PG-1. OD region 15-2 is used to form transistor PG-2. Transistors PD-1 and PD-2 are formed on OD region 15-3, wherein OD region 15-3 forms the bottom plates, which are the common source region (corresponding to regions 28B/26B in FIG. 3) of transistors PD-1 and PD-2. Transistors PU-1 and PU-2 are formed on OD region 15-4, wherein OD region 15-4 forms the bottom plates, which are the common source region (corresponding to regions 28A/26A in FIG. 3) of transistors PU-1 and PU-2. The gate dielectrics that surround the respective channel regions are not shown.

Gate electrode 36-1 is shared by, and encircles the channel regions of, transistors PD-1 and PU-1. Gate electrode 36-2 is shared by, and encircles the channel regions of, transistors PD-2 and PU-2. Gate electrode 36-3 encircles the channel region of transistor PG-1, and is electrically connected to a word-line contact as illustrated. Gate electrode 36-4 encircles the channel region of transistor PG-2, and is electrically to another word-line contact as illustrated.

In some embodiments, transistors PU-1, PD-1, and PG-1 are aligned to a straight line 35-1 extending in the lengthwise direction of SRAM cell 10. Transistors PU-2, PD-2, and PG-2 are aligned to another straight line 35-2 extending in the lengthwise direction of SRAM cell 10.

Figure 6:
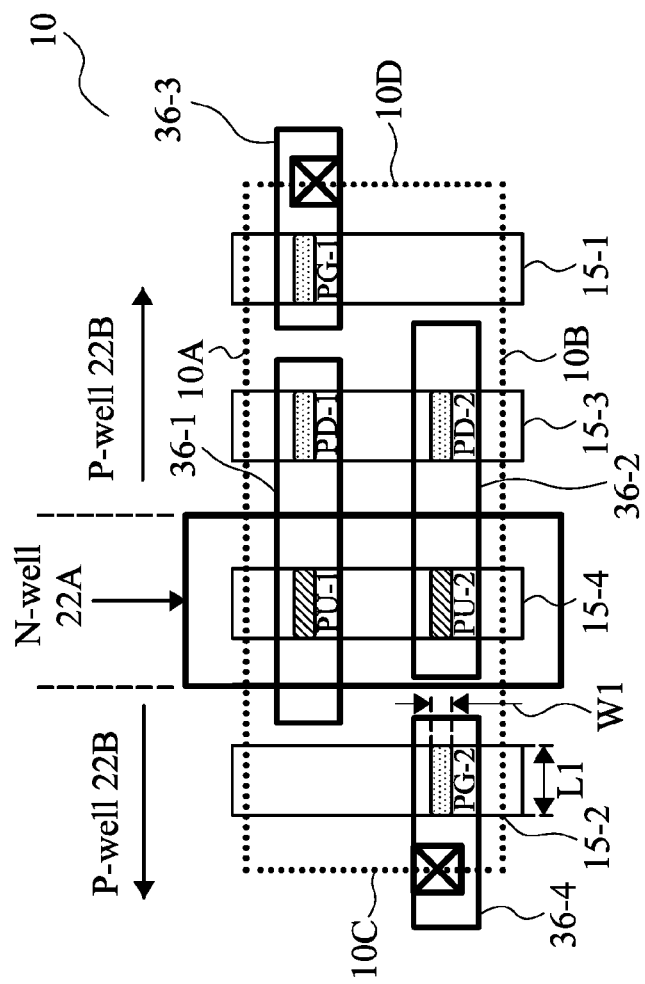
FIG. 6 is an exemplary layout of an SRAM cell in accordance with some embodiments, wherein the channel regions of VGAA transistors are nano-bars.

FIG. 6 illustrates a layout of SRAM cell 10 in accordance with alternative embodiments of the present disclosure. These embodiments are similar to the embodiments in FIG. 5, except that the channel regions of transistors PG-1, PG-2, PU-1, PU-2, PD-1, and PD-2 are nano-bars having length L1 significantly greater than the respective widths W1. The increased length L1 results in an increased channel width, which is equal to 2(L1+W1), and hence the saturation currents of the transistors are high. In accordance with some embodiments, the channel widths (equal to 2(L1+W1), with L1 and W1 belonging to the respective transistor) of pull-down transistors PD-1 and PD-2 are at least 120 percent of the channel widths of pull-up transistors PU-1 and PU-2. The channel widths of pass-gate transistors PG-1 and PG-2 are at least 120 percent of the channel widths of pull-up transistors PU-1 and PU-2. Furthermore, the channel widths of pull-down transistors PD-1 and PD-2 are greater than the channel widths of transistors PU-1, PU-2, PG-1, and PG-2.

Figure 7:
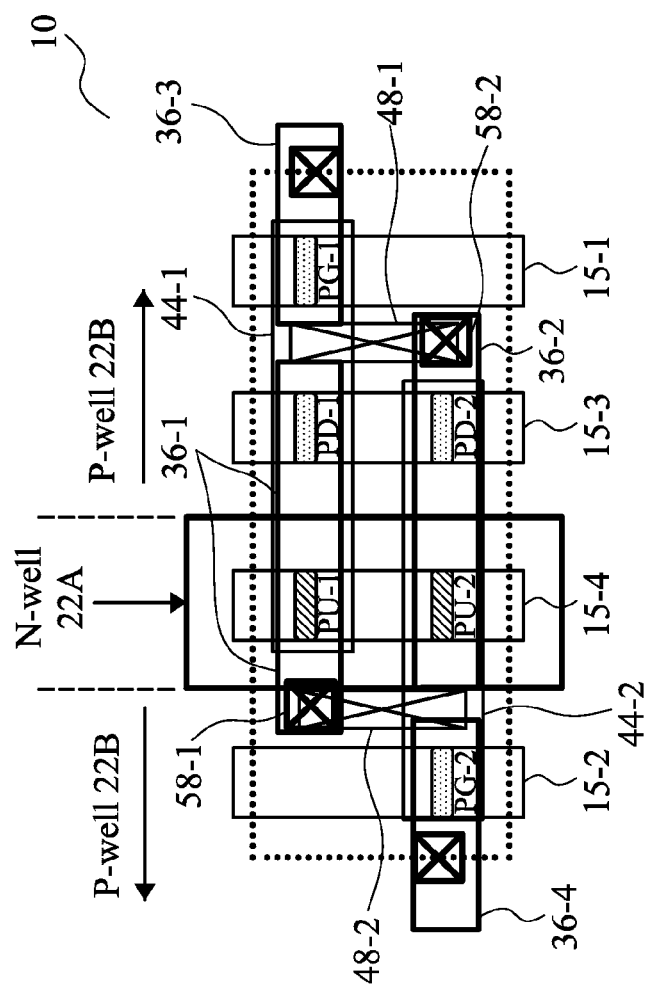
FIGS. 7 through 11 are the layouts of SRAM cells in accordance with exemplary embodiments.

FIG. 7 illustrates the exemplary layout of SRAM cell 10, which is the same SRAM cell 10 as shown in FIG. 6, except additional features such as contacts and top plates (refer to the features in the "contact level" and the "top plate" in FIG. 4) are further illustrated in addition to the features shown in FIG. 6. FIG. 7 illustrates top plates 44-1 and 44-2, which are the top plates of transistors PD-1, PD-2, PU-1, PU-2, PG-1, and PG-2. The positions of the top plates 44-1 and 44-2 may be found referring to the positions of top plates 44A and 44B in FIG. 3. Top plate 44-1 is shared by transistors PU-1, PD-1, and PG-1, and acts as storage node 110 as shown in FIG. 1. Top plate 44-1 also acts as the common drain region of transistors PU-1, PD-1, and PG-1. Top plate 44-2 is shared by transistors PU-2, PD-2, and PG-2, and acts as storage node 112 as shown in FIG. 1. Top plate 44-2 acts as the common drain region of transistors PU-2, PD-2, and PG-2.

As shown in FIG. 7, gate contact 58-2 is formed over, and electrically coupled to, gate electrode 36-2. Local connection 48-1 is formed over and interconnects gate contact 58-2 and top plate 44-1. Accordingly, local connection 48-1 is used to electrically connect the drain regions of transistors PU-1, PD-1, and PG-1 to gate electrode 36-2, which acts as the gate electrodes of transistors PU-2 and PD-2. Gate contact 58-1 is formed over, and electrically coupled to, gate electrode 36-1. Local connection 48-2 is formed over and interconnects gate contact 58-1 and top plate 44-2. Accordingly, local connection 48-2 is used to electrically connect the drain regions of transistors PU-2, PD-2, and PG-2 to gate electrode 36-1, which acts as the gate electrodes of transistors PU-1 and PD-1. Accordingly, gate contacts 58-1 and 58-2 and local connections 48-1 and 48-2 in combination connect transistors PD-1, PD-2, PU-1, PU-2, PG-1, and PG-2 as SRAM cell 10. The connection of SRAM cell 10 is thus very simple. In some embodiments, local connections 48-1 and 48-2 are at the level similar to the level of top plate contacts 48A and 48B as in FIG. 3.

Figure 8:
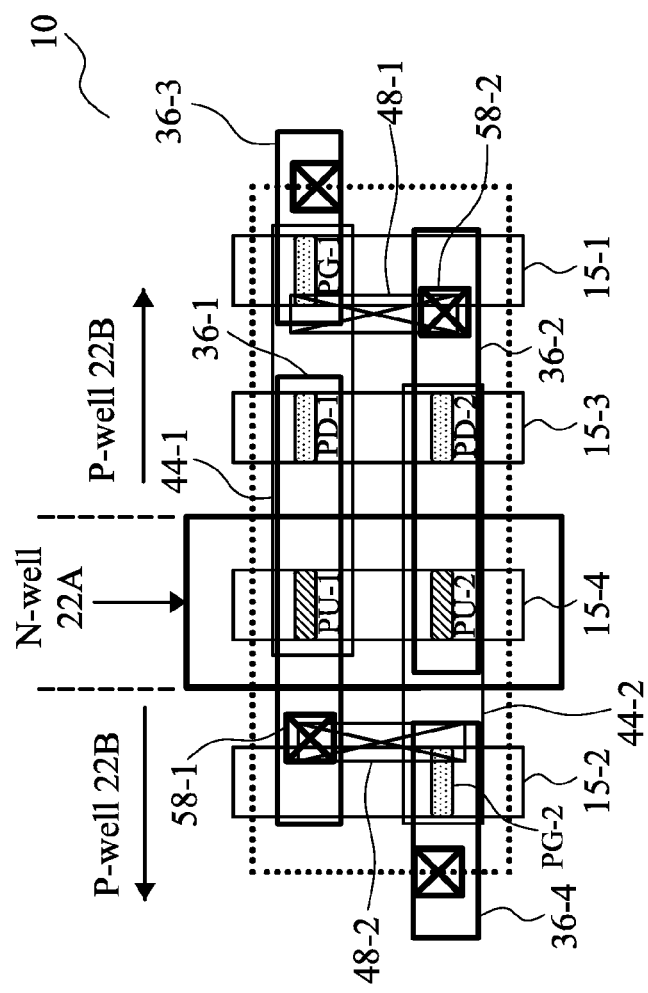

In the embodiments shown in FIG. 7, local connection 48-2 is between, and not overlapping, OD regions 15-2 and 15-4. Similarly, local connection 48-1 is between, and not overlapping, OD regions 15-1 and 15-3. In some embodiments, to reduce the size of SRAM cell, local connections 48-1 and 48-2 may overlap some of OD regions. For example, FIG. 8 illustrates some exemplary embodiments. In these embodiments, a portion of local connection 48-2 overlaps a portion of OD region 15-2. Local connection 48-2 is still vertically spaced apart from, and is electrically disconnected from, OD region 15-2. A portion of local connection 48-1 overlaps a portion of OD region 15-1. In these embodiments, local connection 48-1 is still vertically spaced apart from, and is electrically disconnected from, OD region 15-1.

Figure 9:
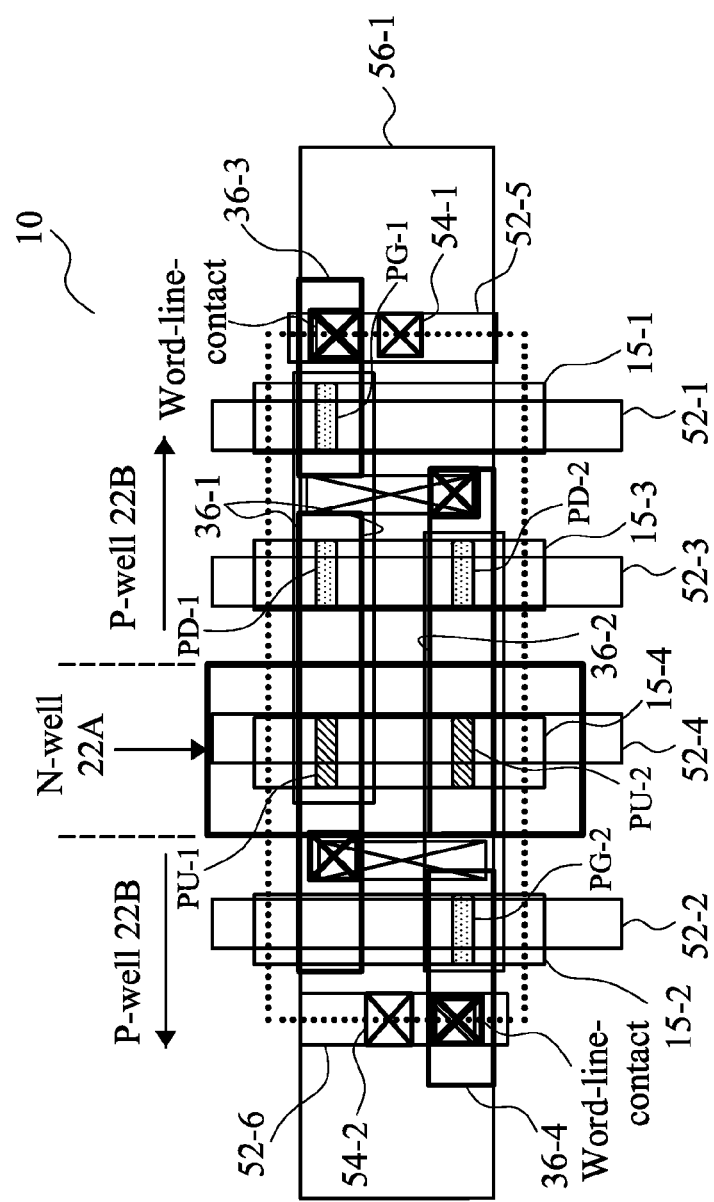
Figure 10:
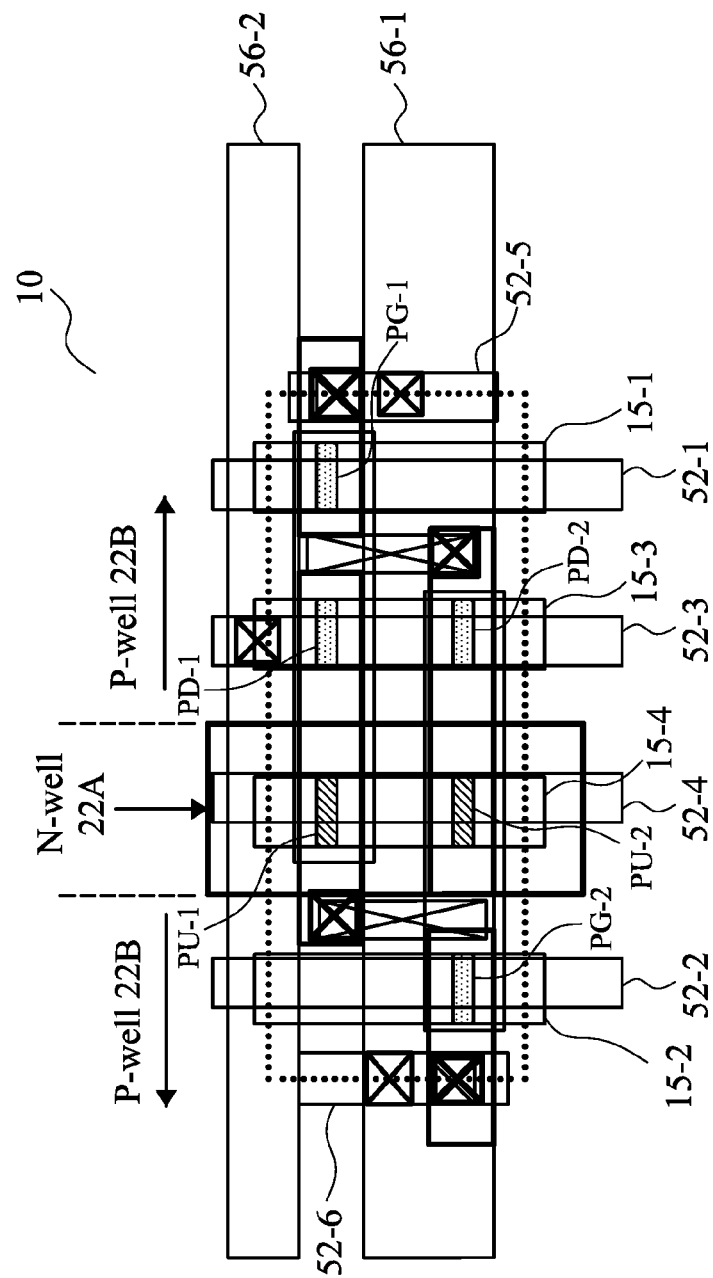
Figure 12:
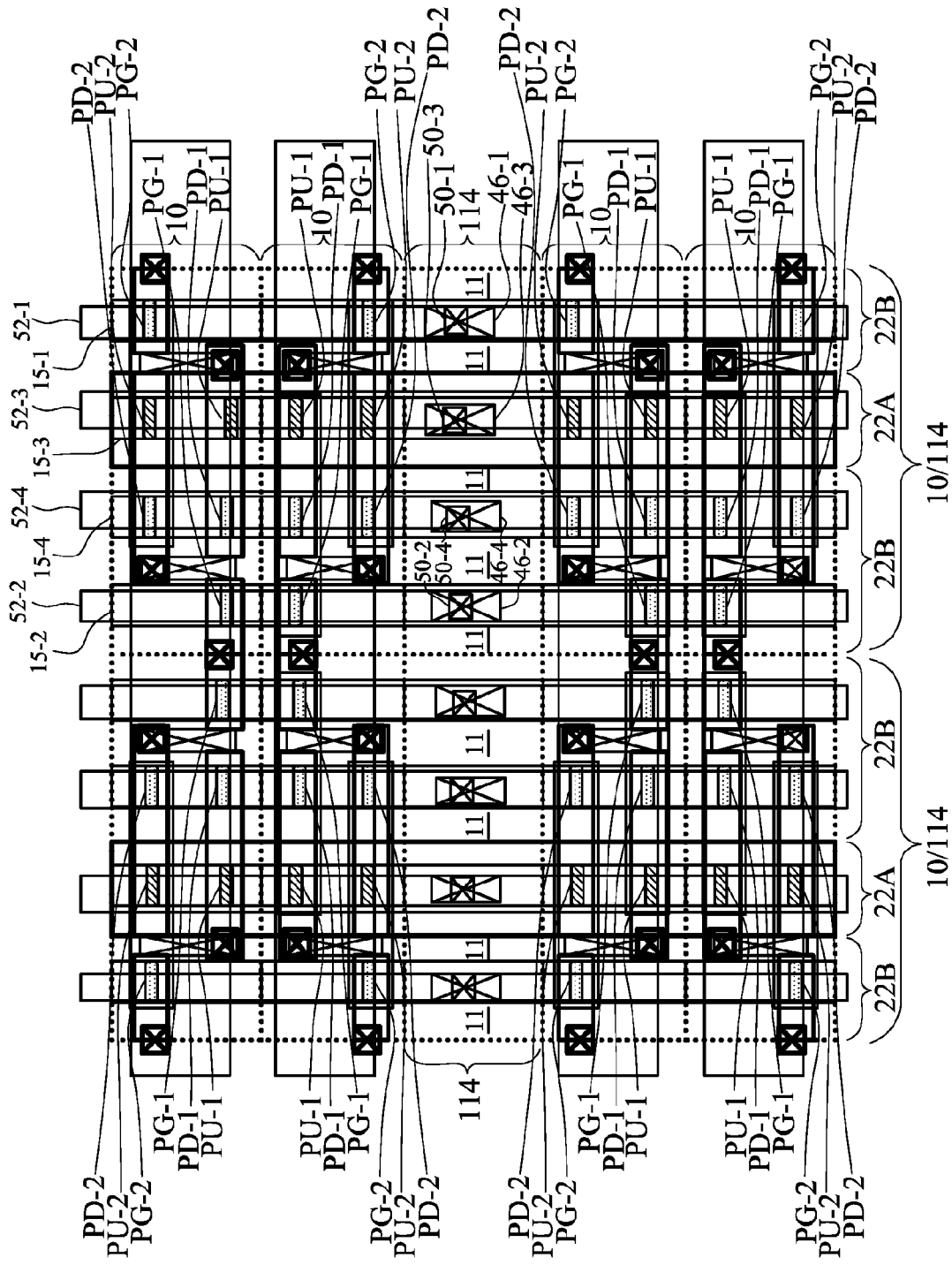
FIG. 12 illustrates an array of SRAM cells and the corresponding active regions and strap cells in accordance with various embodiments.

FIG. 9 illustrates more features in the layout of SRAM cell 10. The layout of SRAM cell 10 in FIG. 9 is similar to the layout of the SRAM cell in FIG. 8, except metal lines and the respective vias are shown in FIG. 9. FIG. 10 illustrates M1 level metal lines such as 52-1 as bit-line BL, 52-2 as bit-line bar BLB, 52-3 as CVss line, and 52-4 as CVdd line. M1 level metal lines 52-1, 52-2, 52-3, and 52-4 extend in the widthwise direction of SRAM cell 10, which may be the column direction. The connections from M1 level metal lines 52-1, 52-2, 52-3, and 52-4 to the underlying ODs 15-1, 15-2, 15-3, and 15-4 are outside SRAM cells, and are shown in FIG. 12.

Further referring to FIG. 9, word-line 56-1 extends in a second direction such as the row direction. Landing islands 52-5 and 52-6 are the metal pads/lines formed in M1 level, and are formed on the boundaries of SRAM cell 10. Word-line 56-1 is formed in the M2 level (refer to FIG. 4), and is electrically connected to M1 landing islands 52-5 and 52-6 through via-2 vias 54-1 and 54-2, and then to gate electrodes 36-3 and 36-4 through the word-line-contacts.

FIG. 10 illustrates the layout of SRAM cell 10 in accordance with some embodiments. These embodiments are similar to the embodiments shown in FIG. 9, except an additional CVss line 56-2 is disposed in M2 level (FIG. 4). CVss line 56-2 is parallel to M2 level word-line 56-1. CVss line 56-2 may form a mesh with the underlying M1 level CVss line 52-2.

Figure 11:
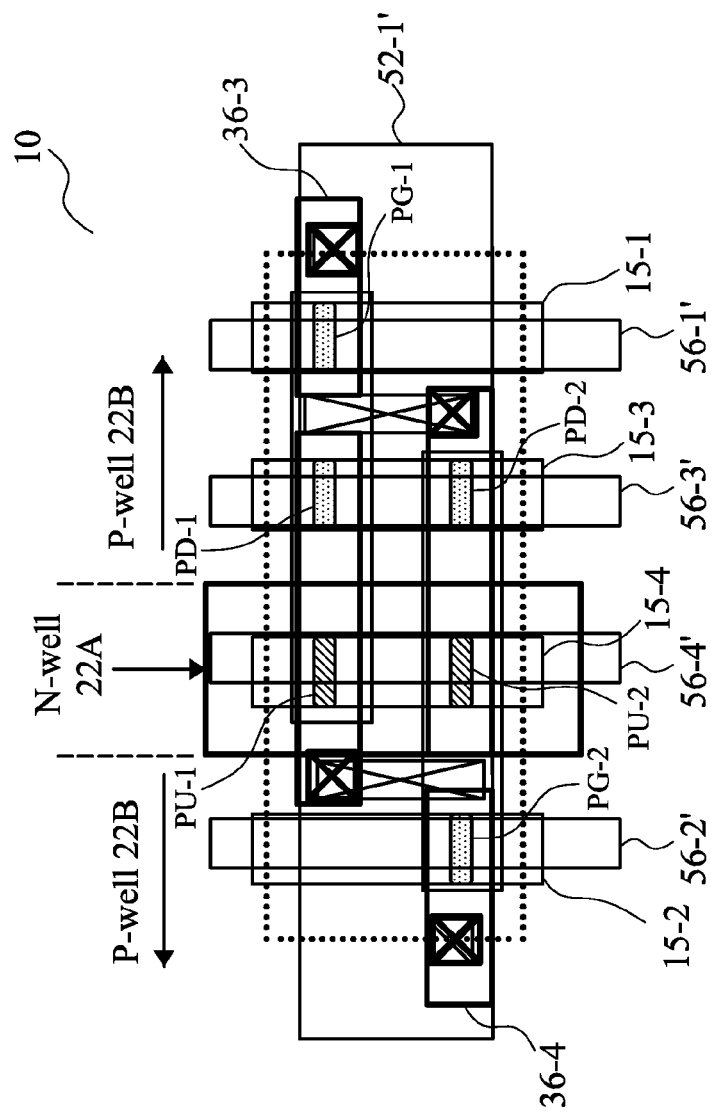

FIG. 11 illustrates the layout of SRAM cell 10 in accordance with yet alternative embodiments. These embodiments differ from the embodiments in FIGS. 9 and 10 in that the M1 level features in FIGS. 9 and 10 are re-deployed in the M2 level in FIG. 11, and the M2 level features in FIGS. 9 and 10 are re-deployed in the M1 level in FIG. 11. For example, FIG. 11 illustrates M2 level metal lines such as 56-1' as bit-line BL, 56-2' as bit-line bar BLB, 56-3' as CVss line, and 56-4' as CVdd line, which extend in the column direction. Word-line 52-1' is provided at the M1 level (refer to FIG. 4), and extends in the row direction. In these embodiments, since word line 52-1' is already in the M1 level, there is no need to form islands (such as 52-5 and 52-6 in FIG. 9) in the M1 level to connect to word line 52-1'. Rather, word line 52-1' may be directly connected to gate electrodes 36-3 and 36-4 through gate contacts.

FIG. 12 illustrates the layout of a plurality of SRAM cells 10 arranged as an array including a plurality of rows and columns, wherein neighboring SRAM cells 10 are butted. Each of OD regions 15-1, 15-2, 15-3, and 15-4 is a continuous and long OD strip that extends through a plurality of rows in accordance with some embodiments. The long and continuous OD strips are separated from each other by STI regions 11, which also form long strips extending in the column direction.

It is appreciated that when OD regions are used to conduct the voltages/signals for bit lines, the CVdd voltage, and the CVss voltage, since the OD regions have high resistance values, there may be high voltage drops on the OD regions. Metal line 52-1, 52-2, 52-3, and 52-4 may thus run in the same direction (parallel to), and may overlap, OD regions 15-1, 15-2, 15-3, and 15-4, respectively, to connect to the respective OD regions. Metal line 52-1, 52-2, 52-3, and 52-4 are accordingly referred to as OD strap lines hereinafter. Since metal lines 52-1, 52-2, 52-3, and 52-4 have much smaller resistances than OD regions 15-1, 15-2, 15-3, and 15-4, the adverse effect of using OD regions as conductors is reduced or substantially eliminated. A plurality of strap cells 114 are thus used to form the contact plugs that connect metal lines 52-1, 52-2, 52-3, and 52-4 to the respective OD regions 15-1, 15-2, 15-3, and 15-4. The connections include via-1 vias 50-1, 50-2, 50-3, and 50-4 and OD contacts 46-1,

46-2, 46-3, and 46-4. Strap cells 114 form a row that separate two neighboring SRAM cell rows.

Figure 13:
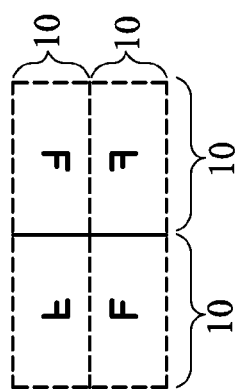
FIG. 13 illustrates the orientations of SRAM cells in an SRAM cell array in accordance with various embodiments.

FIG. 13 illustrates a part of SRAM cell array, which includes four SRAM cells 10. Patterns "F" are shown in SRAM cells 10 to illustrate the relative directions of the layouts of SRAM cells 10. As shown by the directions of patterns F, the layout of the second row of SRAM cells 10 mirrors the layout of the first row of SRAM cells 10, and the layout of the second column of SRAM cells 10 mirrors the layout of the first column of SRAM cells 10.

Figure 14:
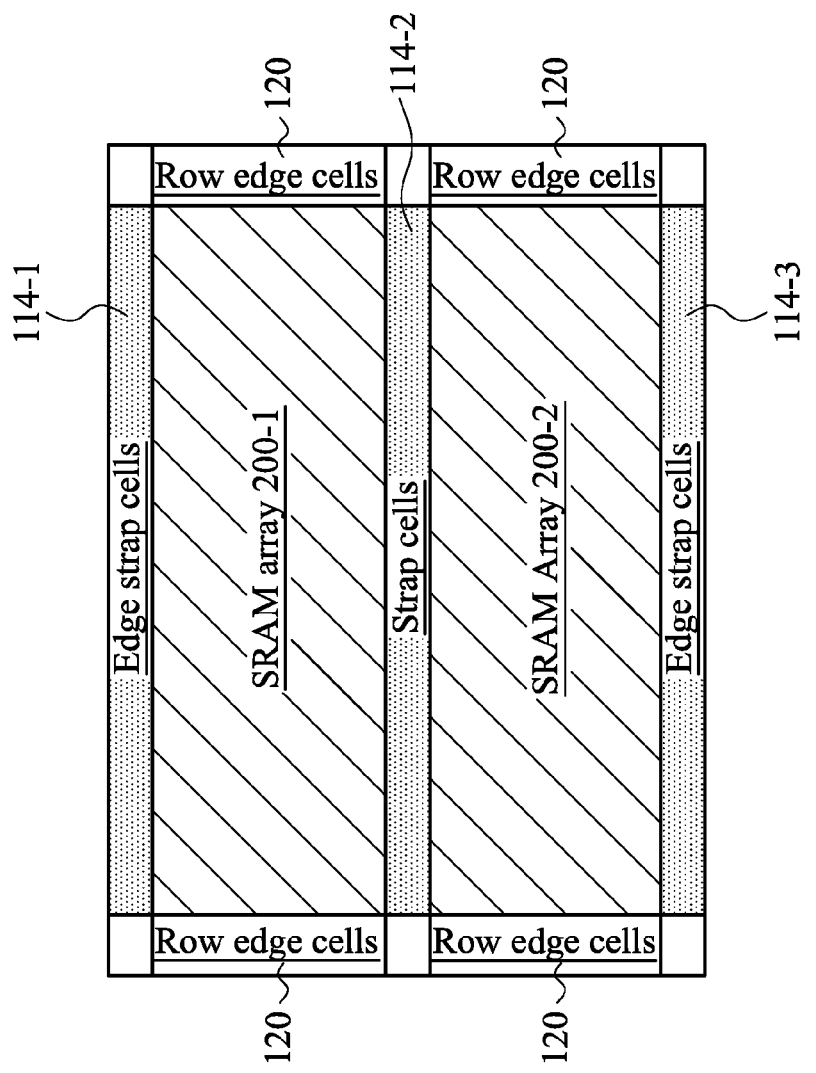
FIG. 14 illustrates a schematic block view of SRAM cell arrays and the corresponding strap cells in accordance with various embodiments.

FIG. 14 illustrates a schematic block view showing SRAM arrays and strap cells. In some embodiments, the rows of strap cells are formed periodically. For example, two strap cells may be formed to butt to the opposite sides of an SRAM array, which includes more than 4 rows (such as 8 rows, 16, rows, 32 rows, or more) and more than 8 columns (such as 16 columns, 32 columns, 64 columns, or more) of SRAM cells. As illustrated, strap cells 114-1 and 114-2 are butted to the opposite sides of SRAM array 200-1, and strap cells 114-2 and 114-3 are butted to the opposite sides of SRAM array 200-2. Row edge cells 120 are butted to opposite sides of SRAM array 200-1, and extend in the column direction. Row edge cells 120 may be used to run additional metal lines, OD regions, gate regions, well strap purpose, dummy contacts, dummy N-wells, dummy P-wells, dummy N+ source/drain regions, dummy P+ source/drain regions, or the like.

Figure 15:
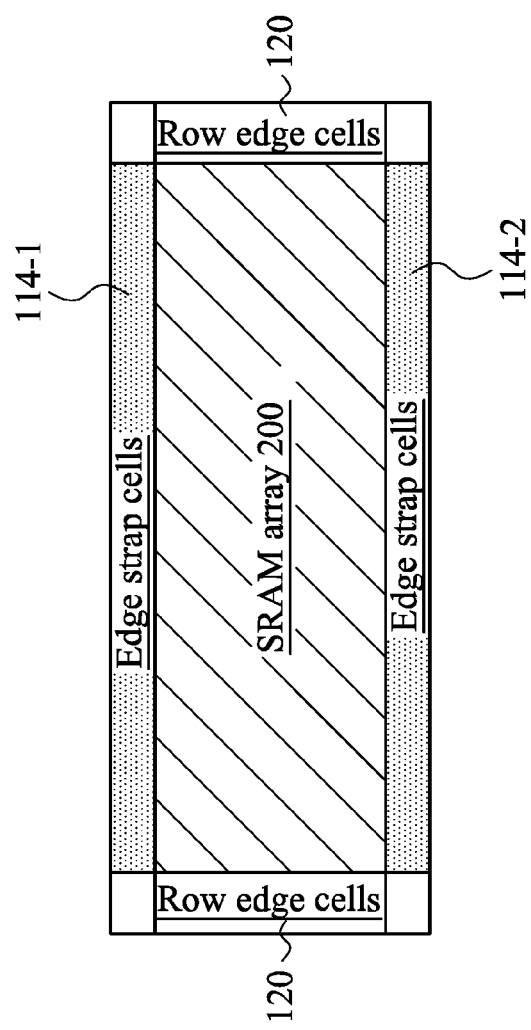
FIG. 15 illustrates a schematic block view of a single SRAM cell array and the corresponding strap cells in accordance with various embodiments.

FIG. 15 illustrates a schematic block view showing a single SRAM array 200 and strap cells 114-1 and 114-2. In some embodiments, SRAM array 200 is small. There is no need to form strap cells in the middle of the array. Rather, all strap cells 114-1 and 114-2 and row edges cells 120 are formed on the outer boundaries of SRAM array 200.

Figure 16:
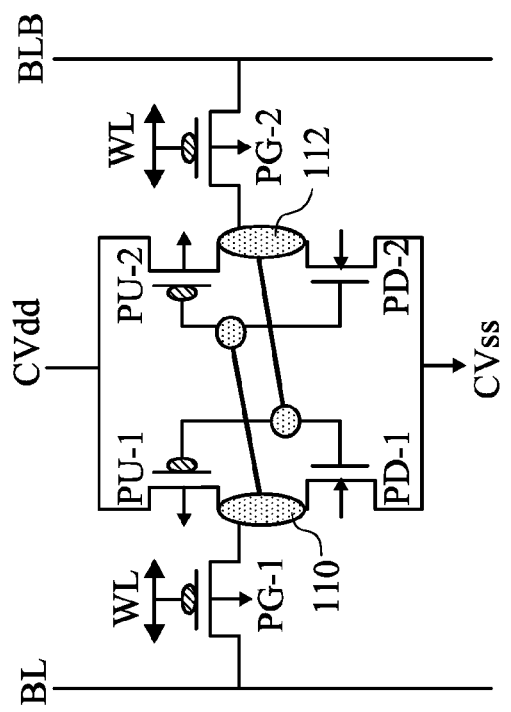
FIGS. 16 and 17 are circuit diagrams of an SRAM cell comprising p-type pass-gate transistors in accordance with some embodiments.
Figure 17:
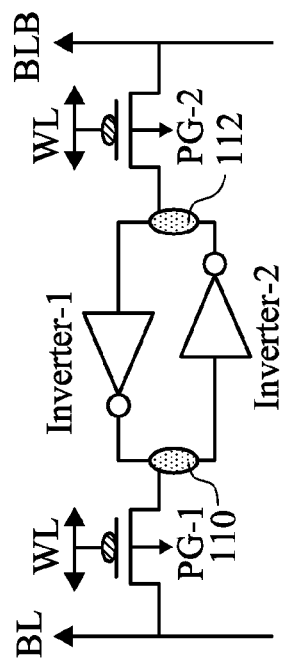

The pass-gate transistors of SRAM cells may use p-type transistors rather than n-type transistors. FIGS. 16 and 17 illustrate the respective circuit diagrams of the SRAM cell 10 in accordance with some embodiments, wherein pass-gate transistors PG-1 and PG-2 are p-type transistors, which are VGAA transistors in accordance with the embodiments of the present disclosure.

Figure 18:
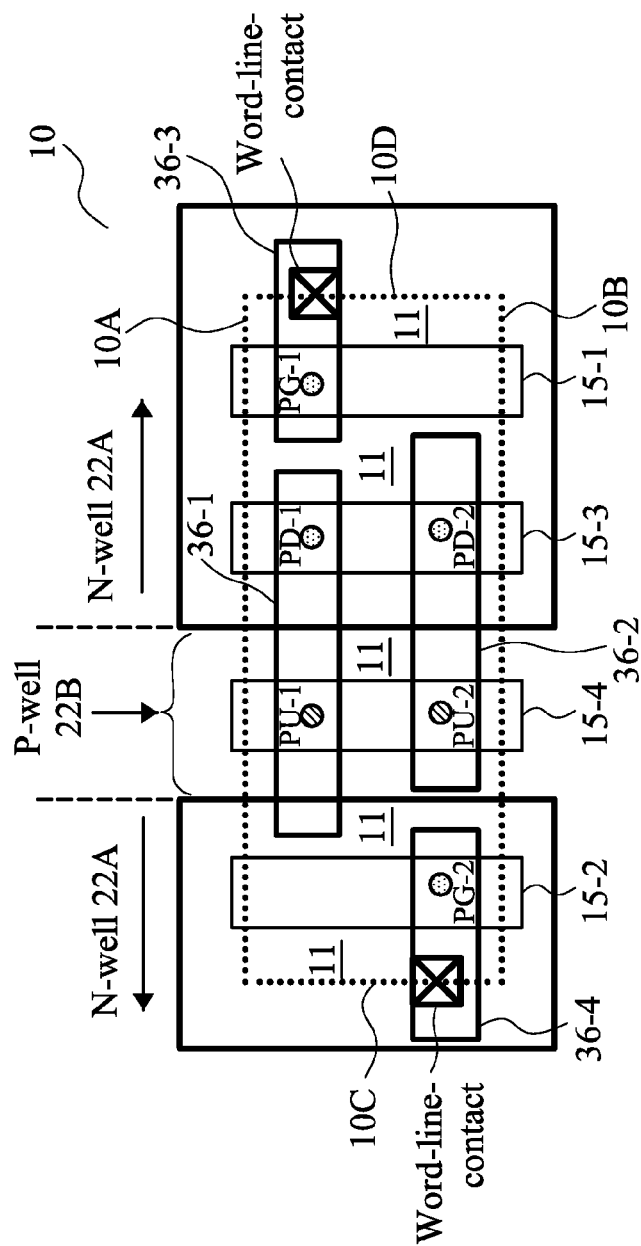
FIG. 18 is an exemplary layout of an SRAM cell comprising p-type pass-gate transistors in accordance with some embodiments, wherein the channel regions of VGAA transistors are nano-wires.

FIG. 18 illustrates a layout of SRAM cell 10 in accordance with some embodiments. SRAM cell 10 includes P-well 22B in the middle, and N-wells 22A on the opposite sides of P-well 22B. Again, in these embodiments, each of OD regions 15-1, 15-2, 15-3, and 15-4 is a continuous OD that extends from boundary 10A to the opposite boundary 10B. When boundaries 10A and 10B are butted to the boundaries of neighboring SRAM cells (not shown, refer to FIG. 12), OD regions 15-1, 15-2, 15-3, and 15-4 will be connected to the ODs of the neighboring SRAM cells. OD regions 15-1, 15-2, 15-3, and 15-4 are parallel with each other, and extend in the widthwise direction of SRAM cell 10. STI regions 11 separate neighboring OD regions 15-1, 15-2, 15-3, and 15-4 from each other.

Figure 19:
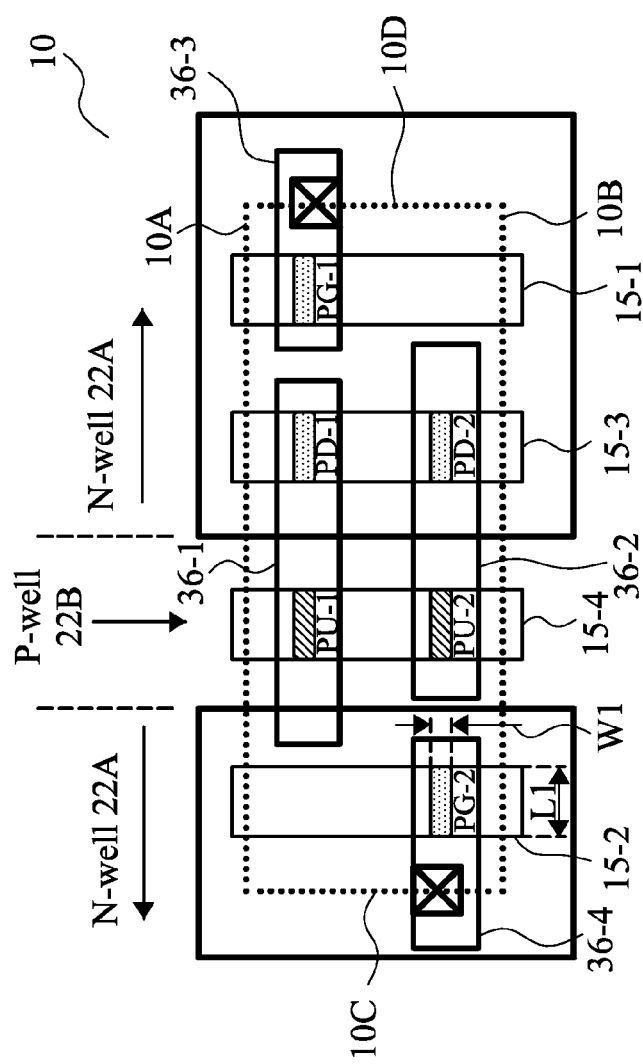
FIG. 19 is an exemplary layout of an SRAM cell in accordance with some embodiments, wherein the channel regions of VGAA transistors are nano-bars.

FIG. 19 illustrates a layout of SRAM cell 10 in accordance with alternative embodiments. These embodiments are similar to the embodiments in FIG. 18, except that the top view of the channel regions of transistors PG-1, PG-2, PU-1, PU-2, PD-1, and PD-2 are nano-bars having length L1 significantly greater than the respective widths W1.

The embodiments of the present disclosure have some advantageous features. By adopting the VGAA transistors in SRAM cells, the size of the SRAM cells may be reduced without sacrificing the saturation currents of the transistors in the SRAM cells. OD regions can be used as CVdd or CVss conductors and the common source regions of transistors PU-1 and PU-2 (or PD-1 and PD-2).

In accordance with some embodiments of the present disclosure, an SRAM cell includes a first boundary and a second boundary opposite to, and parallel to, the first boundary, a first and a second pull-up transistor, a first and a second pull-down transistor forming cross-latched inverters with the first and the second pull-up transistors, and a first and a second pass-gate transistor. Each of the first and the second pull-up transistors, the first and the second pull-down transistors, and the first and the second pass-gate transistors includes a bottom plate as a first source/drain region, a channel over the bottom plate, and a top plate over the channel as a second source/drain region. The SRAM cell further includes a first, a second, a third, and a fourth active region, each extending from the first boundary to the second boundary.

In accordance with alternative embodiments of the present disclosure, an SRAM cell array includes a plurality of SRAM cells arranged as a plurality of rows and columns, and a first, a second, and a third continuous active region. The first continuous active region extends into a column of the plurality of SRAM cells, and acts as a bit line of the column of the plurality of SRAM cells. The second continuous active region extends into the column of the plurality of SRAM cells, and acts as a CVss line of the column of the plurality of SRAM cells. The third continuous active region extends into the column of the plurality of SRAM cells, and acts as a CVdd line of the column of the plurality of SRAM cells.

In accordance with yet alternative embodiments of the present disclosure, an SRAM cell includes a first and a second pull-up transistor, a first and a second pull-down transistor forming cross-latched inverters with the first and the second pull-up transistors, and a first and a second pass-gate transistor. Each of the first and the second pull-up transistors, the first and the second pull-down transistors, and the first and the second pass-gate transistors includes a bottom plate as a first source/drain region, a channel over the bottom plate, and a top plate over the channel as a second source/drain region. A first top plate is shared by the first pull-up transistor, the first pull-down transistor, and the first pass-gate transistor. The first pull-up transistor, the first pull-down transistor, and the first pass-gate transistor are aligned to a first straight line. A second top plate is shared by the second pull-up transistor, the second pull-down transistor, and the second pass-gate transistor. The second pull-up transistor, the second pull-down transistor, and the second pass-gate transistor are aligned to a second straight line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Static Random Access Memory (SRAM) circuit comprising:
   a semiconductor substrate; and
   a first SRAM cell formed at a major top surface of the semiconductor substrate, the SRAM comprising:

a first boundary and a second boundary opposite to, and parallel to, the first boundary, wherein the first boundary and the second boundary are viewed in a top view of the first SRAM cell, wherein the top view is obtained from above the major top surface of the semiconductor substrate, and is obtained in a direction perpendicular the major top surface of the semiconductor substrate;

a first pull-up transistor and a second pull-up transistor;

a first pull-down transistor and a second pull-down transistor forming cross-latched inverters with the first pull-up transistor and the second pull-up transistor;

a first pass-gate transistor and a second pass-gate transistor, wherein each of the first and the second pull-up transistors, the first and the second pull-down transistors, and the first and the second pass-gate transistors comprises a bottom plate as a first source/drain region, a channel over the bottom plate, and a top plate over the channel as a second source/drain region, wherein the top plates of the first pull-up transistor, the first pull-down transistor, and the first pass-gate transistor in combination has a lengthwise direction parallel to the first boundary and the second boundary, and the top plates of the second pull-up transistor, the second pull-down transistor, and the second pass-gate transistor in combination has a lengthwise direction parallel to the first boundary and the second boundary; and a first, a second, a third, and a fourth active region, each extending from the first boundary to the second boundary.

2. The SRAM circuit of claim 1, wherein:

the first active region acts as both the bottom plate of the first pull-up transistor and the bottom plate of the second pull-up transistor; and the second active region acts as both the bottom plate of the first pull-down transistor and the bottom plate of the second pull-down transistor.

3. The SRAM circuit of claim 1, wherein the first active region is a CVdd power node, and the second active region is a CVss power node.

4. The SRAM circuit of claim 1, wherein the third active region is a bit line, and the fourth active region is a complementary bit line.

5. The SRAM circuit of claim 1, wherein the first pull-up transistor, the first pull-down transistor, and the first pass-gate transistor are aligned to a straight line parallel to the first boundary.

6. The SRAM circuit of claim 1, wherein the first pull-up transistor, the first pull-down transistor, and the first pass-gate transistor share a same top plate as a common drain region.

7. The SRAM circuit of claim 1 further comprising a third boundary and a fourth boundary opposite to each other and perpendicular to the first boundary and the second boundary, wherein the first and the second boundaries are longer than the third and the fourth boundaries.

8. The SRAM circuit of claim 1, wherein the first pass-gate transistor and the second pass-gate transistor are n-type transistors, and wherein the SRAM cell comprises an n-well and two p-wells on opposite sides of the n-well.

9. The SRAM circuit of claim 1, wherein the first pass-gate transistor and the second pass-gate transistor are p-type transistors, and wherein the SRAM cell comprises a p-well and two n-wells on opposite sides of the p-well.

10. A Static Random Access Memory (SRAM) circuit comprising:

a plurality of SRAM cells, with boundaries of neighboring ones of the plurality of SRAM cells being abutting each other, wherein a first one of the plurality of SRAM cells comprises:

a first pull-up transistor and a second pull-up transistor;

a first pull-down transistor and a second pull-down transistor forming cross-latched inverters with the first pull-up transistor and the second pull-up transistor;

a first pass-gate transistor and a second pass-gate transistor, wherein each of the first and the second pull-up transistors, the first and the second pull-down transistors, and the first and the second pass-gate transistors comprises a bottom plate as a first source/drain region, a channel over the bottom plate, and a top plate over the channel as a second source/drain region;

a first top plate shared by the first pull-up transistor, the first pull-down transistor, and the first pass-gate transistor, wherein an entirety of the first top plate is a continuous conductive region formed of a first homogenous material, wherein the first pull-up transistor, the first pull-down transistor, and the first pass-gate transistor are aligned to a first straight line; and a second top plate shared by the second pull-up transistor, the second pull-down transistor, and the second pass-gate transistor, wherein an entirety of the second top plate is a continuous conductive region formed of a second homogenous material, wherein the second pull-up transistor, the second pull-down transistor, and the second pass-gate transistor are aligned to a second straight line, and the first top plate and the second top plate are doped semiconductor regions.

11. The SRAM circuit of claim 10, wherein the first one of the plurality of SRAM cells further comprises:

a first boundary and a second boundary opposite to each other, wherein the first boundary of the first one of the plurality of SRAM cells abuts a second boundary of a second one of the plurality of SRAM cells; and a first, a second, a third, and a fourth active region extending from the first boundary to the second boundary, wherein the first, the second, the third, and the fourth active regions act as a bit line, a CVss line, a CVdd line, and a bit line bar, respectively.

12. The SRAM circuit of claim 11, wherein each of the plurality of SRAM cells further comprises:

a first, a second, a third, and a fourth strap line extending from the first boundary to the second boundary, wherein the first, the second, the third, and the fourth strap lines overlap, and are electrically coupled to, the first, the second, the third, and the fourth active regions, respectively.

13. The SRAM circuit of claim 11, wherein the second active region acts as a common source region of the first pull-down transistor and the second pull-down transistor.

14. The SRAM circuit of claim 11, wherein the third active region acts as a common source region of the first pull-up transistor and the second pull-up transistor.

15. The SRAM circuit of claim 10, wherein the first straight line and the second straight line are parallel to each other.

16. The SRAM circuit of claim 1 further comprising a second SRAM cell and a third SRAM cell on opposite sides of the first SRAM cell, wherein the first boundary of the first SRAM cell abuts a boundary of the second SRAM cell, and the second boundary of the first SRAM cell abuts a boundary of the third SRAM cell.

17. The SRAM circuit of claim 16, wherein the each of the first, the second, the third, and the fourth active regions extends into both the second SRAM cell and the third SRAM cell.

18. The SRAM circuit of claim 11 further comprising a second SRAM cell and a third SRAM cell on opposite sides of the first SRAM cell, wherein the first boundary of the first SRAM cell abuts a boundary of the second SRAM cell, and the second boundary of the first SRAM cell abuts a boundary of the third SRAM cell.

19. The SRAM circuit of claim 18, wherein the each of the first, the second, the third, and the fourth active regions extends into both the second SRAM cell and the third SRAM cell.

\* \* \* \* \*